United States Patent
Cotronakis et al.

(10) Patent No.: US 11,329,013 B2
(45) Date of Patent: May 10, 2022

(54) INTERCONNECTED SUBSTRATE ARRAYS CONTAINING ELECTROSTATIC DISCHARGE PROTECTION GRIDS AND ASSOCIATED MICROELECTRONIC PACKAGES

(71) Applicant: NXP USA, Inc., Austin, TX (US)

(72) Inventors: James Cotronakis, Chandler, AZ (US); Jose Luis Suarez, Chandler, AZ (US); Eduard Jan Pabst, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 76 days.

(21) Appl. No.: 16/885,586

(22) Filed: May 28, 2020

(65) Prior Publication Data

US 2021/0375797 A1 Dec. 2, 2021

(51) Int. Cl.
| | |
|---|---|
| *H01L 23/62* | (2006.01) |
| *H01L 21/50* | (2006.01) |
| *H01L 25/065* | (2006.01) |
| *H01L 23/00* | (2006.01) |
| *H01L 23/498* | (2006.01) |

(52) U.S. Cl.
CPC .............. *H01L 23/62* (2013.01); *H01L 21/50* (2013.01); *H01L 23/49816* (2013.01); *H01L 24/06* (2013.01); *H01L 24/49* (2013.01); *H01L 25/0655* (2013.01)

(58) Field of Classification Search
CPC ... H01L 23/62; H01L 23/49816; H01L 24/06; H01L 24/49; H01L 25/0655; H01L 21/50
USPC .......................................................... 257/659
See application file for complete search history.

(56) References Cited

U.S. PATENT DOCUMENTS

| | | | |
|---|---|---|---|
| 7,301,229 B2 | 11/2007 | Yau | |
| 7,532,264 B2 | 5/2009 | Yuan et al. | |
| 7,642,182 B2 | 1/2010 | Mitra et al. | |
| 8,633,575 B1 | 1/2014 | Mangrum | |
| 2002/0151200 A1* | 10/2002 | Fauser | ...................... H01T 4/08 439/181 |
| 2019/0363051 A1* | 11/2019 | Jung | ................... H01L 23/5387 |

* cited by examiner

*Primary Examiner* — Quoc D Hoang

(57) ABSTRACT

Interconnected substrate arrays, microelectronic packages, and methods for fabricating microelectronic packages for fabricating microelectronic packages utilizing interconnected substrate arrays containing integrated electrostatic discharge (ESD) protection grids are provided. In an embodiment, the method includes obtaining an interconnected substrate array having an integrated ESD protection grid. The ESD protection grid includes, in turn, ESD grid lines at least partially formed in singulation streets of an interconnected substrate array and electrically coupling die attachment regions of the substrate array to one or more peripheral machine ground contacts. Array-level fabrication steps are performed to produce an interconnected package array utilizing the interconnected substrate array, while electrically coupling the die attachment regions to electrical ground through the ESD protection grid during at least one of the array-level fabrication steps. Afterwards, the interconnected package array is singulated to yield a plurality of singulated microelectronic packages.

13 Claims, 8 Drawing Sheets

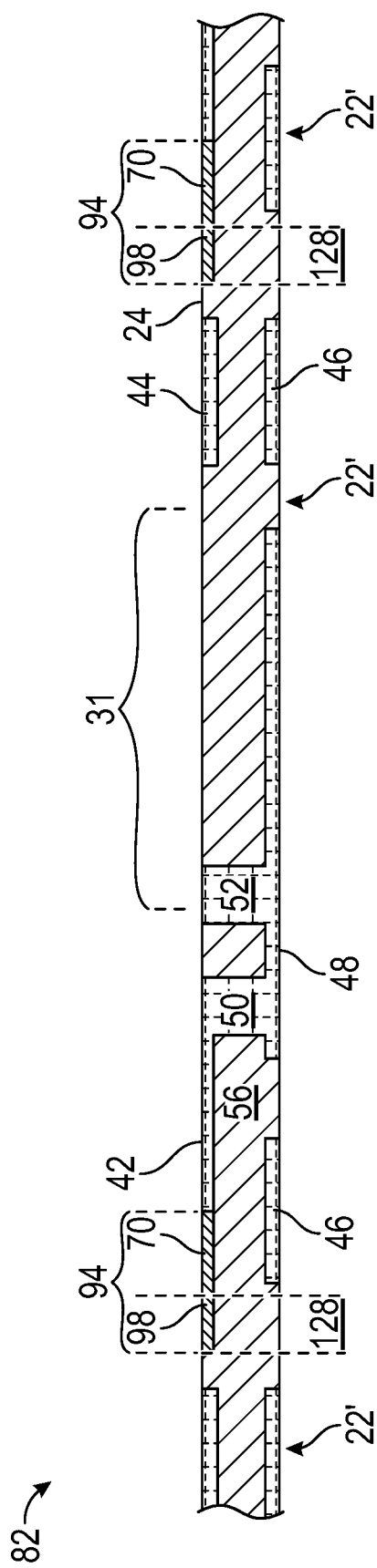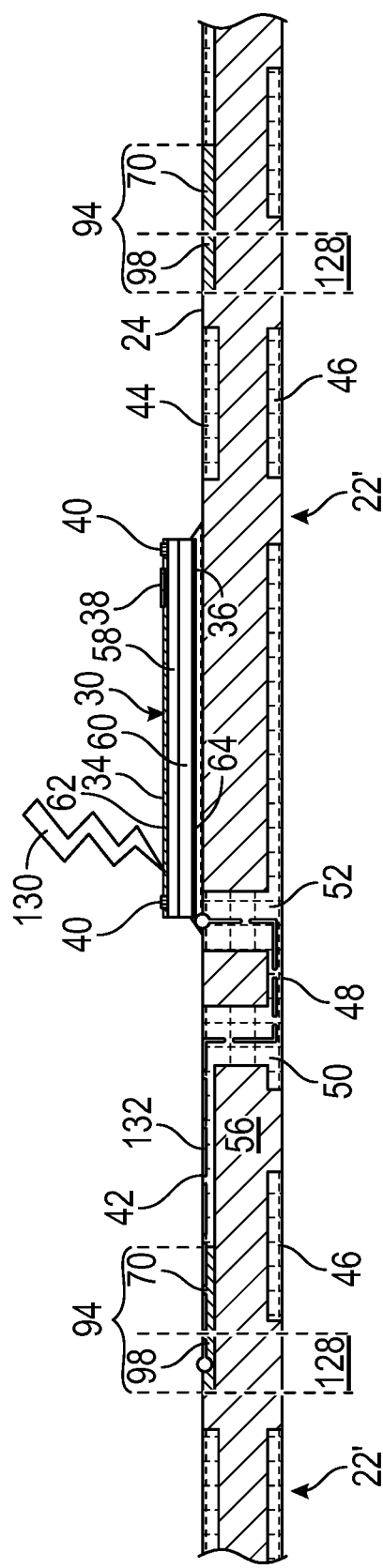

INTERCONNECTED SUBSTRATE ARRAYS CONTAINING ELECTROSTATIC DISCHARGE PROTECTION GRIDS AND ASSOCIATED MICROELECTRONIC PACKAGES

TECHNICAL FIELD

Embodiments of the present disclosure relate generally to microelectronics and, more particularly, to methods for fabricating microelectronic packages utilizing interconnected substrate arrays containing integrated electrostatic discharge (ESD) protection grids, as well as to such substrate strips and microelectronic packages.

ABBREVIATIONS

Abbreviations appearing relatively infrequently in this document are defined upon initial usage, while abbreviations appearing more frequently in this document are defined below:
BGA—ball grid array;
ESD—electrostatic discharge;
IC—integrated circuit
LGA—land grid array;
SMD—surface mount device; and
TSV—through substrate via.

BACKGROUND

A microelectronic package includes a package body containing one or more semiconductor dies, along with any number of discrete SMD capacitors, SMD resistors, SMD inductors, or other microelectronic components. Wire bonds are commonly utilized to provide electrical interconnection between the terminals of a given microelectronic package and the microelectronic component(s) contained therein, with the package terminals assuming various forms depending upon whether the microelectronic package is an LGA package, a BGA package, a leadframe-based package, or another package type. Microelectronic package fabrication can be streamlined by producing multiple packages in parallel via high volume manufacture of interconnected substrate arrays; that is, structures containing multiple substrates interconnected through intervening singulation streets, which are subsequently removed during singulation. In one common manufacturing approach, a substrate panel is initially produced containing a relatively large number of interconnected substrates. The substrate panel is then separated into multiple substrate strips, each having a generally rectangular formfactor well-suited for advancement through different manufacturing equipment stages. A given substrate strip may contain a few interconnected substrates to several hundred interconnected substrates arranged in a grid layout. The elongated rectangular formfactor of the substrate strip may facilitate linear advancement and indexing of the strip through different processing stages, such as die attach, wire bonding, and strip molding process stages. Following such strip-level or array-level processing, the resulting structure is sawed, punched, or otherwise singulated to yield a plurality of discrete package units. Additional process steps may be performed following strip singulation, such as ball attach in the case of BGA packages, to complete fabrication of the discrete packages.

BRIEF DESCRIPTION OF THE DRAWINGS

At least one example of the present invention will hereinafter be described in conjunction with the following figures, wherein like numerals denote like elements, and:

FIGS. 6-10 illustrate, in a step-by-step sequence, manufacturing steps that may be carried-out to fabricate a plurality of microelectronic packages, while reducing the likelihood of array-level fabrication ESD damage in accordance with an example implementation of the package fabrication method set-forth in FIG. 4.

Figure 1:
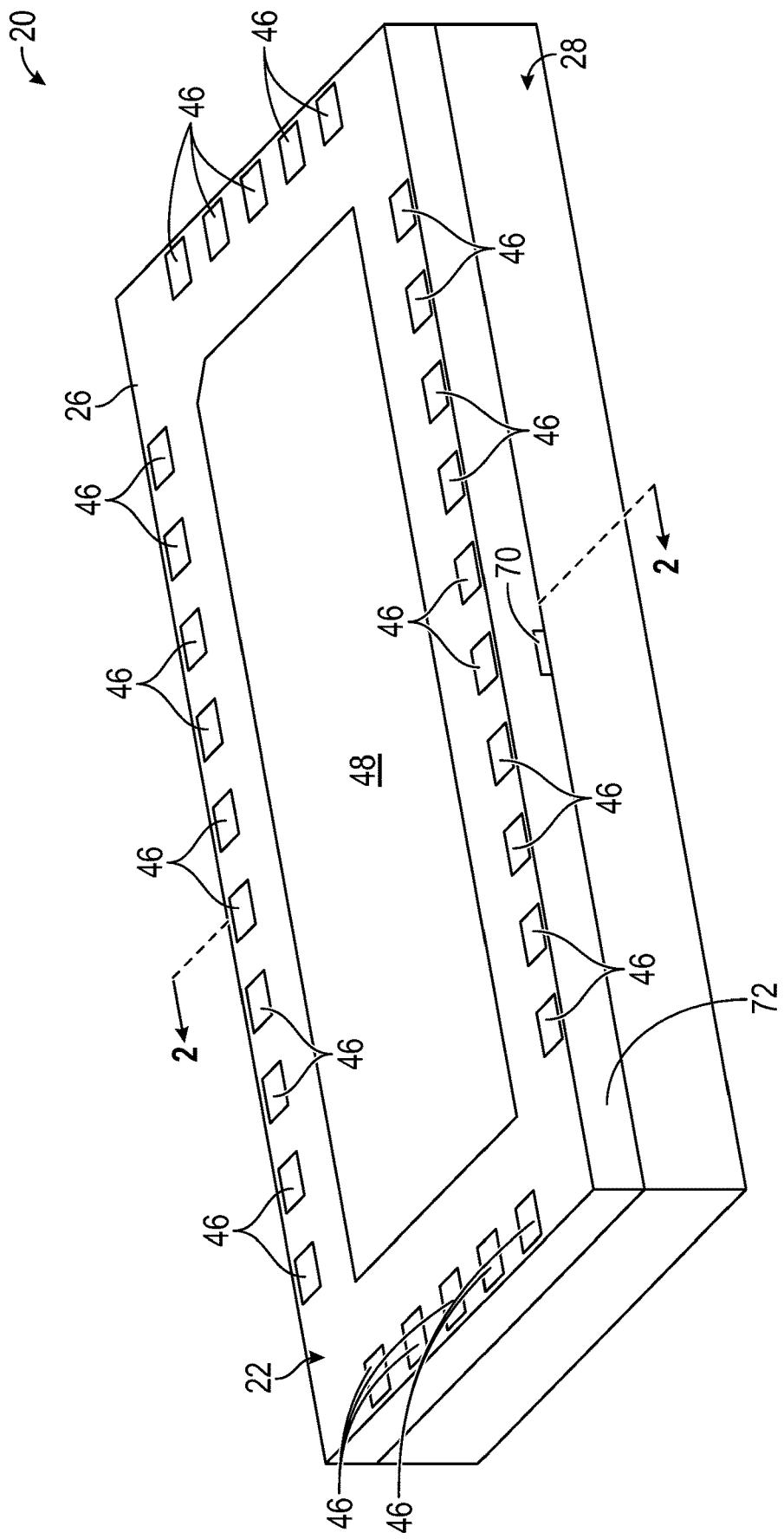
FIG. 1 is an isometric view of an LGA package produced utilizing an interconnected substrate array containing an integrated ESD protection grid, as illustrated in accordance with an example embodiment.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

Definitions

The following definitions apply throughout this document. Those terms not expressly defined here or elsewhere in this document are assigned their ordinary meaning in the relevant technical field.

Die backside—the side (outer principal surface) of a die opposite the frontside of the die (defined below), as taken along an axis orthogonal to the frontside of the die.

Die frontside—the side (outer principal surface) of a die on which the bond pads are exclusively or predominately located.

Metallic—a material predominately composed of one or more metal constituents by weight percentage.

Microelectronic package—a discrete unit containing one or more microelectronic components, such as integrated circuit-bearing semiconductor die, supported by a substrate and at least partially enclosed by a package body. When containing multiple interconnected microelectronic components, such as one or more dies and passive SMD devices, a microelectronic package may be more specifically referred to as a "System-in-Package" or "SiP."

Overview

As noted above, microelectronic packages are commonly fabricated in parallel by processing interconnected substrate arrays, such as substrate strips cleaved from a larger substrate panel. Such substrate strips may undergo an initial die attach processing stage performed utilizing a die bonding machine, which attaches one or more semiconductor dies (and possibly other microelectronic components) to each substrate included in the substrate strip. The die bonding machine may include certain features, such as gripper mechanisms or indexers, engaging the edges of the substrate strip to hold the strip against the support surface of the machine; e.g., the upper surface of a metal chuck. Following die attachment, a wire bond machine having similar features may further process the substrate strip. Specifically, such a wire bond machine may be used to form wire bonds electrically interconnecting the newly-attached dies, and any other microelectronic components attached to the substrate strip, to the substrate terminals (or terminal connections) of the interconnected substrates. The substrate terminal connections may be, for example, electrically-conductive features of the substrate, which provide connection to the externally-accessible terminals of the package; e.g., in the case of an LGA package, the substrate terminal connections may be bond pads provided on the frontside or "die-support surface" of an LGA substrate, which are electrically coupled to bond pads or "lands" exposed along the backside or bottomside of the LGA substrate.

The above-described fabrication techniques enable a relatively large number of microelectronic packages to be manufactured in a relatively streamlined, cost effective manner. However, in certain instances, an undesirably high proportion of microelectronic packages may fail to pass quality testing following array-level processing. Such yield losses directly increase the per-package production costs of viable or saleable microelectronic packages. Yield losses may occur when a microelectronic package fails to pass performance parameter testing at a juncture following the above-mentioned die attach and interconnection (e.g., wire bonding) process steps. Various reasons may underlie the inability of a microelectronic package to pass quality testing measures; often, the particular failure mode or precise mechanims causing rejection, and likely destruction, of a particular package remain unknown. While such yield losses are ideally driven to zero in any given microelectronic package fabrication process, this is often impractical under real world conditions; and a certain amount of unavoidable yield losses are typically tolerated in current manufacturing practices. It has been discovered, however, that such yield losses may be exacerbated when certain conditions create an increased likelihood of device damage due to array-level fabrication ESD events; that is, ESD events occurring during processing of an interconnected substrate array, such as during die attach and wire bonding process steps utilized to produce LGA packages, BGA packages, and similar microelectronic packages from a substrate strip. Array processing ESD events may also negatively affect long term package reliability by, for example, creating low level latent defects unlikely to be detected during final electrical and functional testing. For example, it has been determined that ESD events can create point defectivity in dielectric films, which, while minute and highly difficult to detect, can propagate over time with power and temperature cycling and eventually cause device failure. Similarly, latent defects resulting from array-level fabrication ESD events can occur within transistor gate oxide layers as minor dislocations, which are generally non-detectable, but may ultimately drive device field failure modes over time.

The potential for ESD events to damage microelectronic components contained within a completed microelectronic package, when installed and utilized within a particular system or application, has long been recognized. However, few, if any effective solutions have been offered providing ESD protection during array-level processing of interconnected substrate arrays, such as during strip-level processing of substrate strips. One reason for this may be a general lack of appreciation, in the industrial field at present, of the propensity for damaging ESD events to occur during array-level fabrication. Depending upon processing parameters and other factors, ESD events may occur rarely during array-level processing; and, when occurring, such ESD events may be sufficiently mild in magnitude or duration to avoid damaging sensitive component regions, such as transistor gate dielectric layers, contained within the microelectronic packages. This infrequency or lack of severity of such array-level fabrication ESD events may be due to the intermittent, inadvertent grounding of conductive features of a substrate strip by contact with grounded metal features of die bond machines, wire bond machines, and similar processing equipment utilized to perform different array-level fabrication processes. Additionally, the potential for severe array-level fabrication ESD events is minimized when attaching many conventional semiconductor dies, such as dies fabricated from bulk silicon (Si) wafer having common lattice orientations possessing relatively low electrical resistivities through their respective thicknesses; e.g., electrical resistivities of 100 kilo ohms ($\Omega$) or less, as measured along a vertical axis extending from the frontside to the backside of the die body. Conversely, it has been determined that, when the electrically-conductive features of the substrate strip (or other interconnected substrate array) remain electrically floating and/or high resistivity semiconductor dies are attached to the substrate strip, the opportunity for relatively severe array-level fabrication ESD events inflicting damage to sensitive components and driving corresponding yield losses is significantly increased.

Aside from performing array-level processing within a clean room environment, one manner in which the propensity for array-level fabrication ESD events may be reduced is through the usage of ionizers; that is, devices configured to direct forced ionized airflow against microelectronic workpieces during processing. The potential usage of such ionizers during array-level processing is, however, associated with various shortcomings. Ionizers are often relatively costly and bulky devices. The usage of ionizers may interfere with achieving optimal elevated temperatures during array-level processing (e.g., optimal temperatures for forming inter-metallics during wire bonding) due to the convective cooling effect inherently caused by impinging the substrate strip (or other interconnected substrate array) with forced airflow. Even setting aside such limitations, ionizers may be ineffective at consistently preventing array-level fabrication ESD events. Considering this, an ongoing industry demand exists for technical solutions reducing the likelihood of severe fabrication ESD events during array-level processing of a substrate strip or other interconnected substrate array. Ideally, such solutions would be amenable to integration into various different substrate strips (or other interconnected substrate arrays) with little additional cost and while requiring minimal changes to existing substrate designs or layouts. It would also be desirable for such solutions to be compatible with a wide range of manufacturing equipment of the type utilized to perform die attach, electrical interconnection (e.g., wire bonding), and other array-level process steps.

In satisfaction of the above-described industrial need, the following discloses interconnected substrate arrays, microelectronic packages, and methods for fabricating microelectronic packages for fabricating microelectronic packages utilizing interconnected substrate arrays containing integrated ESD protection grids. In many instances, the below-described interconnected substrate arrays assume the form of substrate strips having generally rectangular planform shapes or formfactors and are consequently principally described below as such. It is emphasized, however, the teachings presented herein are equally applicable to any type of interconnected substrate array, regardless of formfactor or structural composition, which is processed to yield a plurality of microelectronic packages vulnerable to ESD damage during array-level processing. Advantageously, embodiments of the below-described ESD protection grids can be integrated into existing substrate array designs with minimal added cost, while providing compatibility with a wide range of array-level processing equipment including die attach and wire bonding machines. Further, the integrated ESD protection grids described herein are highly effective at preventing or at least reducing the severity of array-level fabrication ESD events, including when high resistivity dies are attached to designated die bond areas of a given interconnected substrate array; e.g., IC dies produced using gallium nitride (GaN) structures, gallium arsenide (GaAs) structures, or certain silicon (Si) materials (including high resistivity Si materials) well-suited for TSV integration, to list but a few examples. Considerable cost savings may be realized by reducing yield losses at high volume manufacture scales; e.g., testing indicates that yield losses may be reduced by more than 3% in certain instances. Further, a greater consistency in achieving optimal package performance levels and improving overall reliability may be achieved by minimizing instances of microelectronic packages mildly damaged by array processing EDS events and on the margins of quality testing parameters.

Embodiments of the integrated ESD protection grid include intersecting grid lines, which electrically interconnect die attach regions of the interconnected substrate array with peripheral grounding structures or contacts located adjacent one or more peripheral edges of the substrate array into which the ESD protection grid is integrated. For example, in the case of a substrate strip having elongated side edges, the ESD protection grid may connect to one or more elongated peripheral ground contacts, such as elongated bar-shaped metal regions extending substantially parallel to an elongated side edge of the strip. In instances in which the substrate strip (or other interconnected substrate array) is encapsulated or overmolded, the peripheral ground contacts may be combined with or connect to mold gate metal features of the strip; that is, metallized areas of the strip contacted by mold material when initially injected or otherwise dispensed over the strip during strip-level processing. Such peripheral ground contacts are electrically contacted by grounded structures of the processing equipment (e.g., grounded gripper mechanisms or indexers) during array-level processing to provide a low resistance path to ground extending from the die attach regions of the interconnected substrate array to electrical ground. In instances in which a given die is attached to a designated die attach region utilizing an electrically-conductive bond material, such as a metal-containing epoxy, a low resistance electrical path is likewise provided from the die backside, through the die attach region, through the integrated ESD protection grid, through the peripheral machine ground contact(s), and ultimately to electrical ground (chassis ground) of the processing equipment. The likelihood for highly charged static electric field (e-field) accumulation adjacent each IC die is consequently reduced to bring about corresponding reductions in the likelihood of severe array-level fabrication ESD events, which may otherwise potentially damage IC dies (or other microelectronic components bonded to the substrate array) during array-level processing. More broadly, such semiconductor dies and any other microelectronic components (e.g., SMDs) incorporated into a given microelectronic package are protected from ESD events occurring at any given location across the entirety of the package subject to array-level manufacturing.

In the above-described manner, the integration of ESD protection grids into substrate strips or other interconnected substrate arrays minimizes the likelihood and severity of array-level fabrication ESD events. This, in turn, reduces yield losses that may otherwise occur due to such ESD events, particularly when high resistivity IC dies are bonded to the substrate array, interconnected, and otherwise processed during array-level processing. Concurrently, the integrated ESD protection grid is at least partially, if not predominately formed in the singulation streets of the interconnected substrate array; e.g., a volumetric majority of the ESD protection grid may be located in the singulation streets of a given substrate array. The provision of the ESD protection grid thus occupies a small fraction of the design-relevant area of the package substrates forming the interconnected substrate array. As a corollary, a majority, if not the substantial entirety (again, by volume) of the ESD protection grid may be removed during singulation of the interconnected substrate array into individual units following die attach, interconnection (e.g., wire bonding), and any additional array-level processing steps (e.g., substrate array overmolding) performed to transform an integrated substrate array into an interconnected package array ready for singulation. Small artifacts of the ESD protection grid may, however, remain in the completed microelectronic packages, such as severed grid lines (also referred to below as "extension tabs") previously connecting, whether directly or indirectly, the die attach regions to the ESD protection grid and now terminating at outer peripheral sidewalls of the package substrate, as further discussed below.

Additional protection from array-level fabrication ESD events may also be provided, in embodiments, utilizing unique, frontside ESD grounding structures in the frontside layers of the semiconductor dies, which are bonded to the die attach regions of the interconnected substrate array. Such frontside ESD grounding structures may be formed on the die frontside at locations adjacent the outer edges of a given die; and, further, may be electrically coupled to the die backside by one or more TSVs; the term "TSV" denoting "through substrate via," as previously noted, with the more specific term "through silicon via" reserved for instances in which a TSV is formed in a die at least partly composed of silicon. The provision of such ESD grounding structures may be beneficial to further provide a low resistivity grounding path extending from the die frontside to the die backside and, therefore, through the die attach region, through the integrated ESD protection grid, and to chassis or machine ground of processing equipment. This may, in turn, reduce the build-up of static charge adjacent the frontside of the semiconductor die in certain instances to further lower the susceptibility of the die to array-level fabrication ESD damage. A given ESD ground structure may be leveraged to provide other functions in the completed package, if so desired. Such other functions can include the formation of shield structures to reduce radio frequency (RF) interference or cross-talk in RF applications, such as in the case of power amplifier (PA) packages containing RF power die. In other instances, the ESD ground structure may be realized as a ring-shaped structure extending around the upper periphery of the frontside of a semiconductor die to form a physical barrier against the ingress of moisture and other contaminants. When providing this function, the ESD ground structure may also be referred to as an "grounded seal ring" below. In further embodiments, the below-described fabrication methods may be conducted without the usage of such frontside ESD ground structures, while processing a substrate strip (or other interconnected substrate array) containing an integrated ESD protection grid. Examples of microelectronic packages fabricated utilizing interconnected substrate array arrays containing integrated ESD protection grids will now be described in connection with FIGS. 1-10, with such packages usefully, but non-essentially further containing grounded seal rings or other such frontside ESD ground structure in embodiments.

Figure 2:
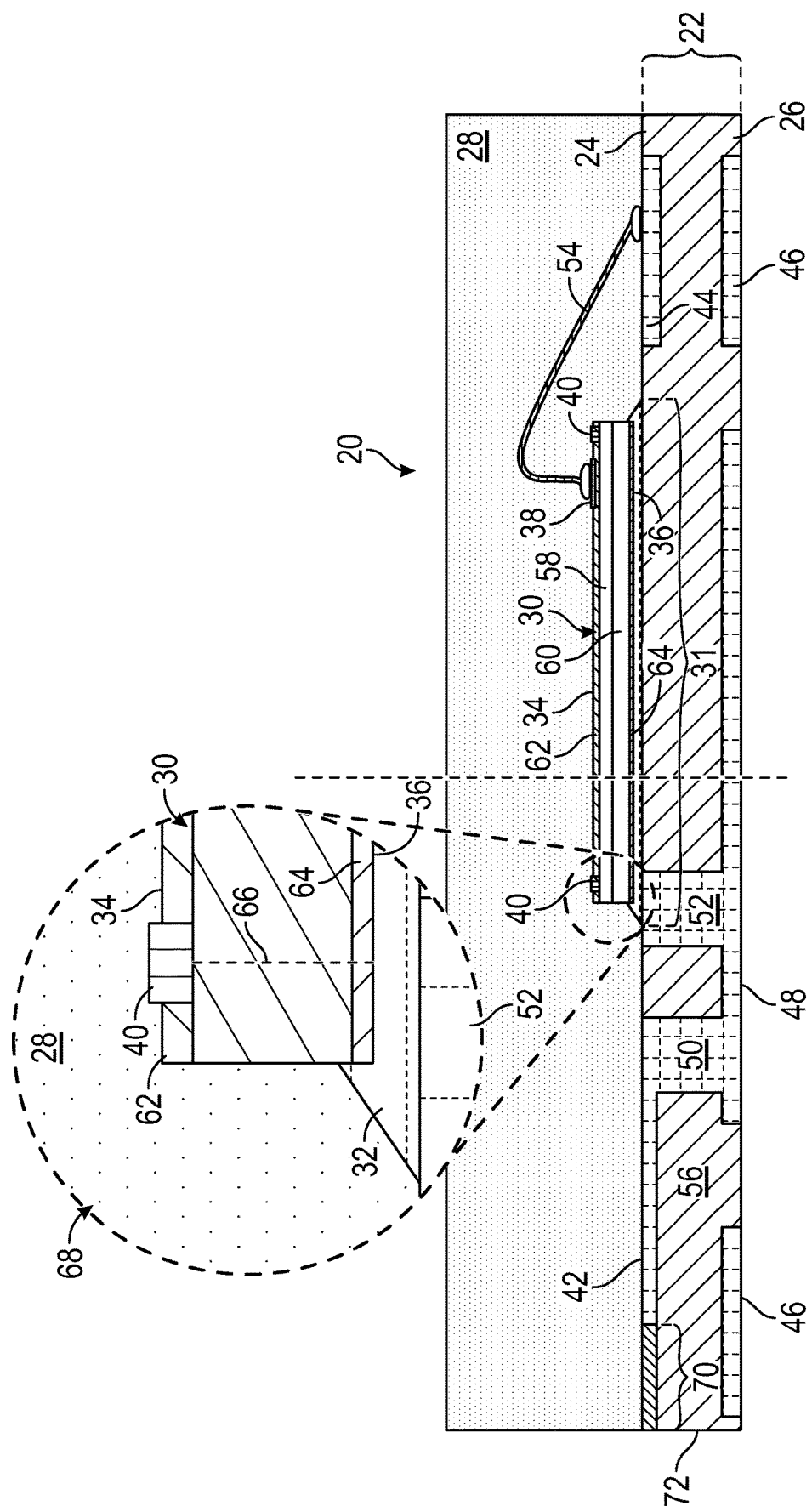
FIG. 2 is a cross-sectional view of the example LGA package shown in FIG. 1, as taken along section plane 2-2 (identified in FIG. 1)

Example Microelectronic Package Fabricated Utilizing an Interconnected Substrate Array Containing an Integrated ESD Protection Grid FIGS. 1 and 2 are isometric and cross-sectional views, respectively, of an example microelectronic package 20 fabricated by processing an interconnected substrate array containing an integrated ESD protection grid. In this particular example, microelectronic package 20 assumes the form of an LGA package and will thus be referred to hereafter as "LGA package 20." It is emphasized, however, that the following description is equally applicable to other packages types, such as BGA packages, amenable to fabrication utilizing an interconnected substrate array into which an ESD protection grid has been integrated. A non-exhaustive list of other package types potentially fabricated in accordance with the teachings set-forth herein includes BGA packages and flat no-lead packages or micro leadframe (MLF) packages, such as quad-flat no-lead (QFN) and dual-flat no-lead (DFN) packages. Example methods for fabricating LGA package 20 along with a number of similar or identical packages are discussed below in connection with FIGS. 4-10. First, however, LGA package 20 is described in more detail to provide a non-limiting context in which embodiments of the present description may be better understood.

In a general sense, LGA package 20 shares many structural features in common with a typical LGA package. For example, LGA package 20 includes a package substrate 22 (hereafter, "LGA substrate 22") having a frontside or "die support surface" 24 and an opposing backside 26. A molded package body 28 is formed over and bonded to die support surface 24 of LGA substrate 22. One or more microelectronic devices are bonded to LGA substrate 22 and embedded within molded package body 28. For example, as can be seen in the cross-section of FIG. 2, a semiconductor or integrated circuit die 30 (hereafter, "IC die 30") may be attached to die support surface 24 of LGA substrate 22 by a die bond layer 32. Specifically, IC die 30 may be bonded to a designed region or area of die support surface 24 referred to herein as a "die attach region 31." At least a portion of die attach region 31 is composed of an electrically-conductive material and electrically coupled to IC die 30 (specifically, to die backside 36 as described below) through die bond layer 32. To provide such an electrical connection, die bond layer 32 is composed of an electrically-conductive bonding material, such as a metal-filled epoxy, a solder, or a sintered material. As a more specific example, die bond layer 32 may be composed of a die attach material loaded with metal particles, such as silver (Ag) or copper (Cu) particles, in some implementations. In other instances, and as a second example, die bond layer 32 may be composed of a sintered material predominately composed of Ag, Cu, or a combination thereof, by weight.

IC die 30 include an upper principal surface or frontside 34 opposite lower principal surface or "backside" 36. Backside 36 of IC dies 30 are attached to the upper principal surface or die support surface 24 of package substrate 22 by die bond layers 28, as previously mentioned. Circuitry is formed on frontside 34 of IC die 30 along with a number of bond pads 38 (one of which can be seen in FIG. 2). Additionally, an ESD grounding structure 40 is formed on frontside 34 of IC die 30 in embodiments, as further described below. Bond pads 38 are electrically interconnected with selected ones of electrically-conductive features 42, 44, 46, 48, 50, 52 of LGA substrate 22 via wire bonds 54. Specifically, as indicated on the right side of FIG. 2 for one such bond pad 38, each bond pad 38 may be electrically connected to patterned landing pad or bond pad 44 included in an upper patterned metal layer 42, 44 of LGA substrate 22. Upper patterned metal layer 42, 44 may be electrically coupled to a lower patterned metal layer 46, 48 by any number of TSVs 50, 52 and through any number of intervening patterned metal layers. In the illustrated example, lower patterned metal layer 46, 48 defines a plurality of smaller terminals or lands 46 exposed at backside 26, which may be arranged in one or more rows extending substantially parallel to the edge regions of LGA substrate 22 (best observed in FIG. 1). Additionally, lower metal layer 46, 48 may also be patterned to define a relatively large central contact, which may serve as an additional terminal 48 of LGA package 20 and may also function as a heatsink or heatspreader in embodiments. In the illustrated example, terminal 48 is both a ground plane and a ground terminal of LGA package 20 and is thus referred to hereafter as "ground terminal 48." The various electrically-conductive features of LGA substrate 22 are electrically isolated by a dielectric body 56, which may be formed as one or more layers of a printed circuit board (PCB) resin, a dielectric polymer containing fillers, multi-layer alumina, a low temperature co-fired ceramic, or another dielectric material. In further embodiments, LGA substrate 22 may contain a greater or lesser number of wiring layers or may otherwise have a different construction, such as that of a coreless substrate. Generally, then, embodiments of the present disclosure are applicable to any assembly or manufacturing process in which ESD damage may occur and carried-out utilizing a substrate array or carrier having any suitable substrate construction and composition.

IC die 30 may be produced utilizing any suitable die technology and may carry different IC designs, depending on the desired functionality of IC die 30. In embodiments, IC die 30 may be fabricated utilizing a bulk piece of silicon (Si) or another semiconductor material. In other embodiments, IC die 30 may be produced using a layered die structure. This is generically illustrated in FIG. 2 for IC die 30, which is illustrated as including a die body 58, 60 over which frontside layers 62 are produced. Die body 58, 60 can be composed of a single semiconductor material when, for example, IC die 30 is produced utilizing a singulated piece of a bulk Si wafer. Alternatively, die body 58, 60 can be composed of multiple layers of disparate materials including at least one layer or body of a semiconductor material. In this latter regard, in implementations in which IC die 30 is produced utilizing a layered (e.g., GaN) die technology, an upper portion 58 of die body 58, 60 may be essentially or predominantly composed of a first semiconductor material (e.g., GaN) by weight, while a lower portion 60 of die body 58, 60 is composed of another material (or combination of materials), such as silicon carbide (SiC), on which the first semiconductor (e.g., GaN) layer is formed. In other instances, IC die 30 may be fabricated utilizing another die technology providing relatively high resistance dies, such as IC dies produced using GaAs die structures or Si materials having high resistivity lattice orientations well-suited for TSV integration. Frontside layers 62 also include additional patterned metal layers defining bond pads 38 and interconnect lines, dielectric layers for providing isolation between the discrete features of the patterned metal layers, and perhaps an outer passivation layer at least partially defining frontside 34 of IC die 30. Opposite die frontside 34, a backmetal layer or multi-layer system 64 may be provided to promote metallurgical bonding and low resistance electrical contact with die bond layer 28. Such a construction may be useful when, for example, IC die 30 assumes the form of a radio frequency (RF) power die containing one or more transistors, such as Field Effect Transistors (FETs), utilized for RF signal or power amplification purposes. In other embodiments, IC die 30 may carry other circuit elements (including one or more bipolar transistors) and/or may lack such a backmetal layer or multi-layer system.

Figure 3:
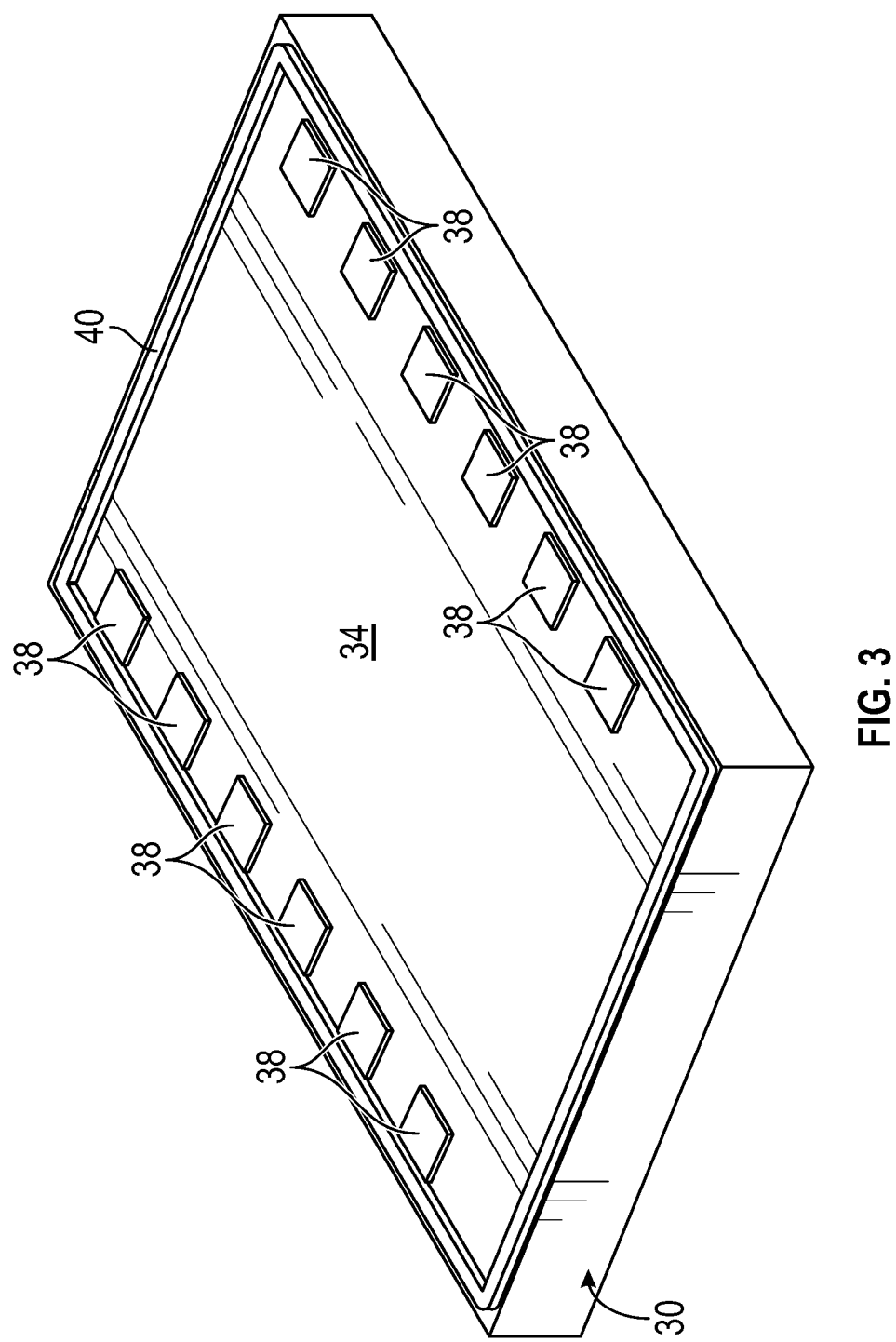
FIG. 3 is an isometric view of a semiconductor die contained in the LGA package shown in FIGS. 1 and 2 illustrating, among other features, an ESD grounding structure (here, also functioning as a seal ring) that may be formed on the frontside of a packaged die in embodiments.

As noted above, an ESD grounding structure 40 may also be formed on frontside 34 of IC die 30 in embodiments. When provided, ESD grounding structure 40 is electrically coupled to die backside 36 by, for example, one or more TSVs 66 formed through die body 58, 60, as indicated in FIG. 2 by detail bubble 68. Prior to encapsulation or overmolding of IC die 30, ESD grounding structure 40 may be exposed from the exterior of frontside 34 to further reduce the accumulation of static charge along frontside 34 of IC die 30 during manufacture of LGA package 20. Further, in embodiments, ESD grounding structure 40 may be leveraged to serve an additional purpose post-package manufacture. For example, ESD grounding structure 40 may be dimensioned and positioned to serve as an EMI shield in embodiments. In other instances, ESD grounding structure 40 may be formed to have a ring-shaped geometry extending around an outer periphery of frontside 34 and serve as a seal ring; that is, a physical barrier to the ingress of contaminants into the frontside layers 62. This may be more fully appreciated by briefly referring to FIG. 3 depicting one manner in which ESD grounding structure 40 may be produced to have a ring-shaped geometry extending around an outer periphery of frontside 34 of die frontside 34, perhaps flanking die bond pads 38 as depicted. ESD grounding structure 40 can be composed of various different electrically-conductive materials including non-metallic materials, such as polysilicon; and metallic materials, such as gold, germanium gold, tungsten silicide, and aluminum copper tungsten, to list but a few examples.

LGA package 20 further includes at least one severed segment 70 of an ESD protection grid line (hereafter referred to as "tab extension 70"), which extends to and penetrates or breaches a sidewall 72 of LGA substrate 22 or, more generally, of LGA package 20, as shown in FIGS. 1 and 2. Extension tab 70 is an artifact or remnant of a larger ESD protection grid, which was integrated into the interconnected substrate array from which LGA package 20 was produced. In this regard, LGA package 20 is conveniently manufactured in parallel with a number of similar LGA packages utilizing such an interconnected substrate array in the form of a substrate strip, which contains such an integrated ESD protection grid providing enhanced ESD protection during array-level processing of the strip. In other embodiments, a larger portion the integrated ESD protection grid may remain within the completed LGA package 20; however, as described more fully below, the integrated ESD protection grid is advantageously positioned, in predominate part, within the singulation streets separating the LGA packages when in a partially-fabricated, interconnected state. Consequently, the integrated LGA protection grid may be largely destroyed following singulation of the interconnected package array to yield a plurality of singulated LGA package units including LGA package 20. Further description of an example method for fabricating LGA package 20 in conjunction with a plurality of similar or identical packages, along with a more detailed discussion of an example embodiment of the ESD protection grid, is set-forth in the following section connection with FIGS. 4-10.

Figure 4:
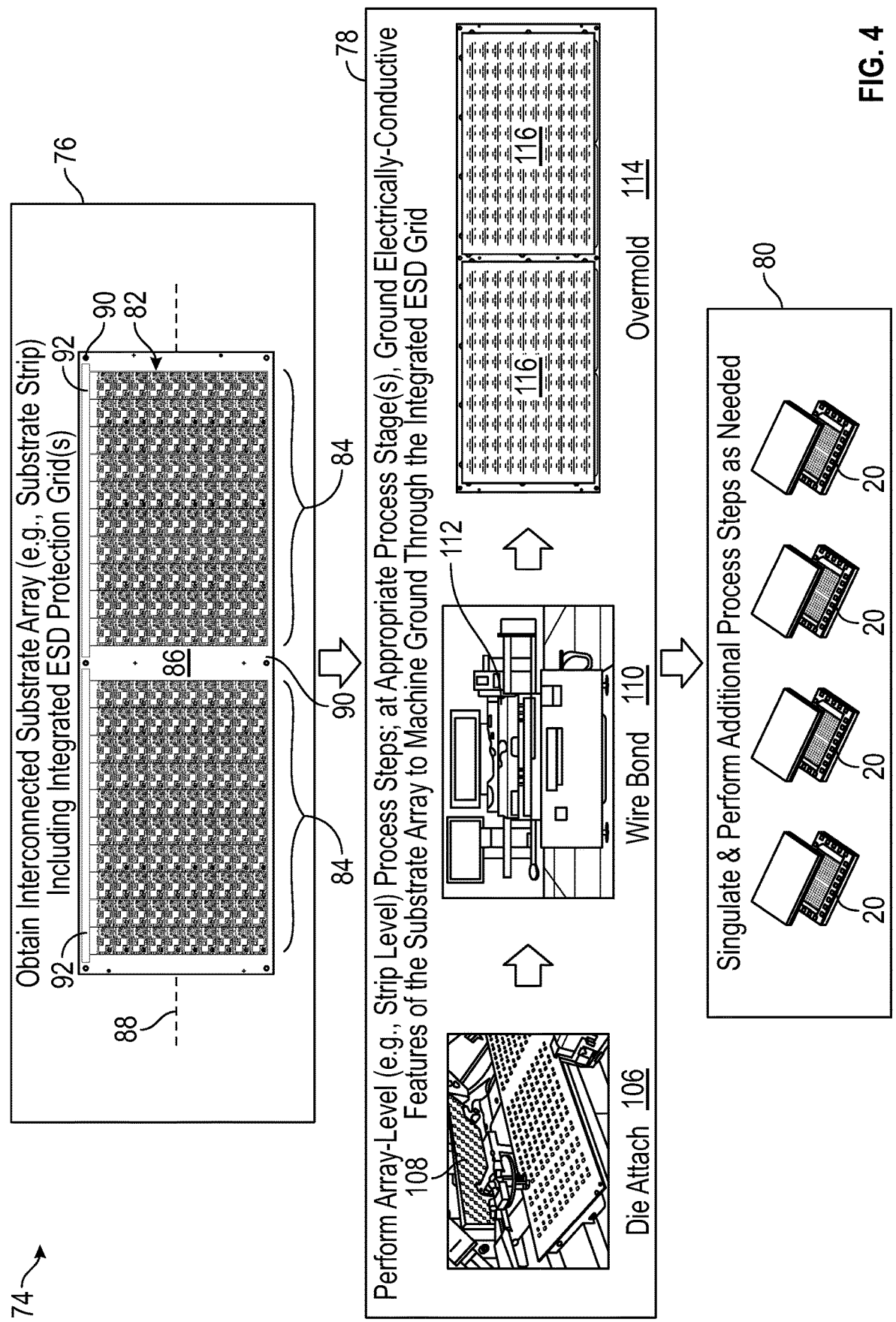
FIG. 4 is an example method for fabricating a plurality of microelectronic packages, such as multiple instances of the example LGA package shown in FIGS. 1 and 2, utilizing an interconnected substrate array containing an integrated ESD protection grid.

Example Package Fabrication Method Utilizing an Interconnected Substrate Array Containing Integrated ESD Protection Grids Turning now to FIG. 4, an example package fabrication method 74 is presented for manufacturing a plurality of microelectronic packages utilizing an interconnected substrate array into which an integrated ESD protection grid has been integrated. In keeping with the foregoing description, package fabrication method 74 will be described as producing a plurality of LGA packages similar or identical to LGA package 20 discussed above in connection with FIGS. 1-3, with the previously-introduced reference numerals carried forward to FIGS. 4-10 as appropriate. It is emphasized, however, that package fabrication method 74 can be utilized in the manufacture of other LGA packages and, more broadly, other package types benefiting from enhanced ESD protection during array-level processing. For example, the below-described method is readily adaptable to produce BGA packages, which may resemble LGA packages through a majority of processing stages leading to ball attach or bumping. Notably, as the below-described ESD protection grid is a passive structure integrated into the interconnected substrate array (e.g., substrate strip) itself, the ESD protection grid is portable to or amenable to integration into a wide range of interconnected substrate arrays and is readily deployable into most assembly processes. As noted above, variations of method 74 are equally applicable to fabrication of other microelectronic package types including, but not limited to, BGA and MLF (e.g., QFN and DFN) packages.

In the illustrated example, package fabrication method 74 is divided into three process stages or blocks 76, 78, 80. To initiate method 74 (STAGE 76), an interconnected substrate array including one or more integrated ESD protection grids is obtained, whether by independent fabrication, by purchase from a supplier, or in another manner. Here, the integrated substrate array obtained during STAGE 76 is an elongated substrate strip 82 containing a relatively large number of interconnected LGA substrates arranged in two grid layouts 84, which are separated by an intervening mid-region or area 86. Substrate strip 82 is elongated along a longitudinal axis (represented by dashed line 88) and includes two longitudinal (length-wise) edges 90, which extend substantially parallel to longitudinal axis 88. Peripheral machine ground contacts 92 are formed adjacent edge regions of substrate strip 82. For example, as shown in an upper portion of FIG. 4, peripheral machine ground contacts 92 may be formed as elongated strips or bars, which are located adjacent and extend substantially parallel to one of elongated edges 90 of substrate strip 82 (and, as a corollary, extend substantially parallel to longitudinal axis 88 of strip 82. Such positioning of peripheral machine ground contacts 92 facilitates electrical grounding through physical contact with a grounded feature of one or more pieces of processing equipment; e.g., a gripper mechanism or indexing mechanism included in a die attach machine and/or a wire bond machine. In embodiments in which substrate strip 82 is overmolded, ground contacts 92 may also serve as mold metal regions positioned at locations of strip 82 initially contacted by heated mold material when directed over strip 82 during molding. Stated differently, the peripheral machine ground contacts 92 may be formed as part of elongated metal features, which are initially impinged by mold material when introduced through a mold gate when the interconnected substrate array, the IC dies, and the wire bonds are overmolded in embodiments.

Figure 5:
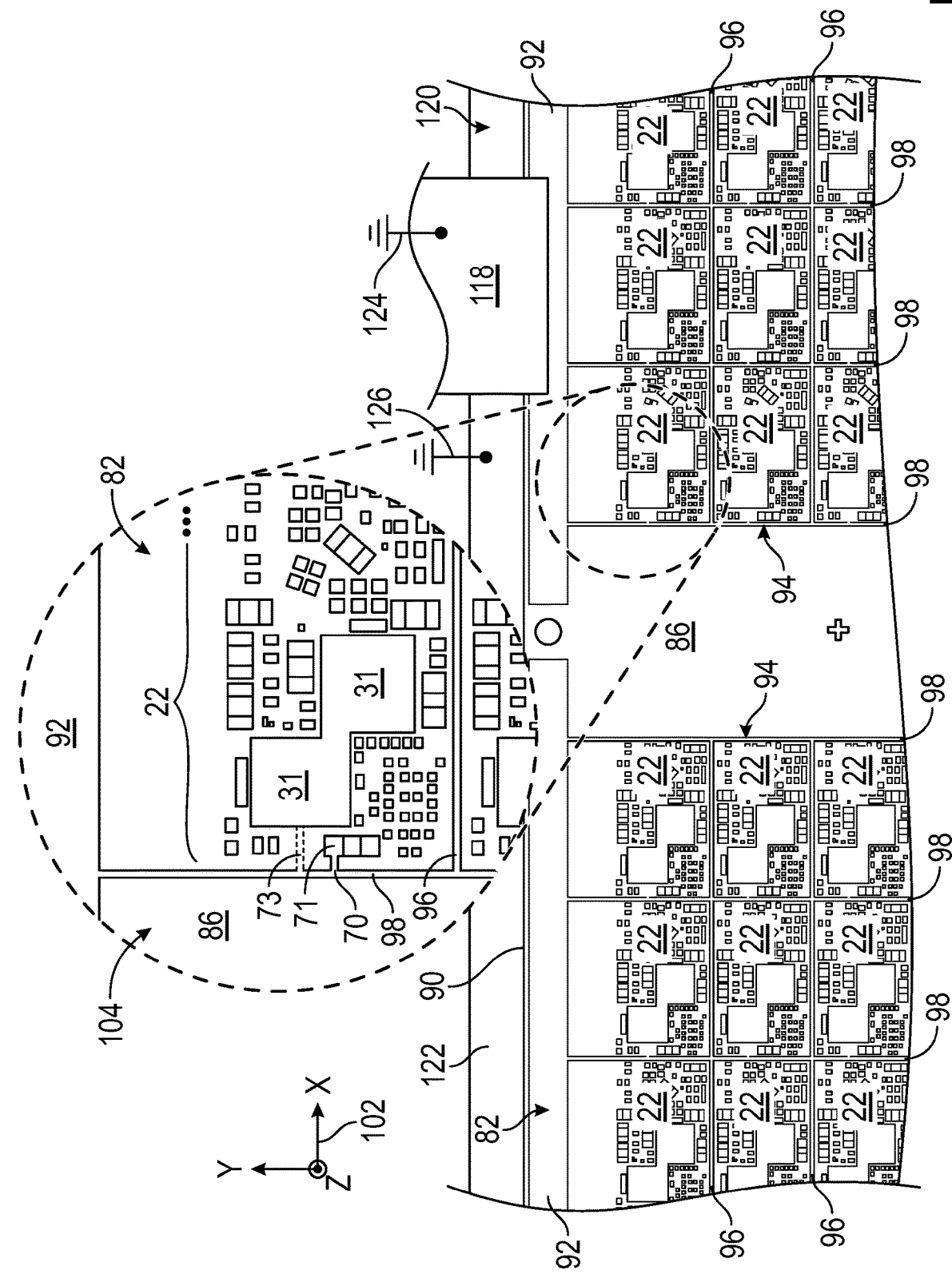
FIG. 5 is planform view of an interconnected substrate array (herein, a substrate strip) into which an ESD protection grid has been integrated, as depicted in accordance with an example embodiment of the present disclosure.

Referring to FIG. 5, a more detailed planform view of a region of substrate strip 82 is shown. Two ESD protection grids 94 are integrated into substrate strip 82, with each ESD protection grid 94 interspersed with one of substrate grid layouts 84. Each ESD protection grid 94 contains multiple electrically-conductive traces or lines 96, 98 formed in the dielectric body of substrate strip 82 (hereafter, "dielectric strip body 100"). In embodiments, traces or lines 96, 98 (hereafter, "ESD grid lines 96, 98") are formed as metal (e.g., copper (Cu)) features, which each have a thickness less than an average global thickness (and, perhaps, less than half the average thickness) of substrate strip 82, as measured along an axis orthogonal to the frontside of substrate strip 82 (corresponding to the Z-axis of coordinate legend 102 in FIG. 5). This may minimize saw blade wear in embodiments in which ESD protection grids 94 are predominantly located in the singulation streets of substrate strip 82 and strip 82 is singulated by sawing. In addition to extension tabs 70, ESD protection grids 94 each include longitudinal ESD grid lines 96 (extending parallel to the longitudinal axis 88 of substrate strip 82 and corresponding to the X-axis of coordinate legend 102 in FIG. 5) and lateral ESD grid lines 98 (extending perpendicular to the longitudinal axis 88 of substrate strip 82 and corresponding to the Y-axis of coordinate legend 102). ESD grid lines 96, 98 intersect as shown to form a grid or lattice-like structure, with grid lines 96, 98 flanking the outer peripheries of interconnected package (LGA) substrates 22. ESD grid lines 96, 98 may be predominately, if not substantially entirely formed in the singulation streets of substrate strip 82 and, therefore, removed following singulation of strip 82, as further discussed below in connection with FIGS. 6-10.

In alternative implementations, ESD protection grids 94 may have other structural layouts or routing schemes, providing the ESD protection grid or grids integrated into a given interconnected substrate array (here, the substrate strip 82) electrically couple the die attach region(s) to peripheral machine ground contact(s) further included in the substrate array. In this regard, and as best seen in detail bubble 104 appearing in an upper portion of FIG. 5, die attach regions 31 of the illustrated LGA substrates 22 may each be electrically connected to a peripheral machine ground contacts 92 through a first grid line segment (namely, extension tab 70) and then ESD grid lines 96, 98. Specifically, in the illustrated embodiment, extension tab 70 extends from metallized feature 71 to which a terminal of a passive SMD, such as a chip cap, may be subsequently bonded by, for example, soldering. Extension tab 70 extends from feature 71 to the illustrated grid line 98 and, therefore, the larger ESD protection grid 94, as shown in detail bubble 104. Feature 71 is electrically coupled to metallized die attach regions 31 through certain metal routing features of the substrate strip 82, which may include various vias, interconnect lines, and a ground plane; e.g., ground plane 48 shown in FIG. 2. Extension tab 70 (and, more broadly, ESD protection grid 94) is likewise electrically coupled to die attach regions 31, albeit indirectly in the illustrated example.

In further embodiments, extension tab 70 may be relocated to a different position electrically coupling die attach regions 31 to the larger ESD protection grid 94; e.g., as shown in phantom in detail bubble 104, in certain embodiments extension tab 70 may be moved (by design) to a location 73 directly connecting one of die attach regions 31 to the neighboring grid line 98 and, therefore, the larger ESD protection grid 94. Moreover, extension tabs may be formed at each of the illustrated locations 70, 73 in still further embodiments for additional enhancement in ESD protection, noting that any practical number of extension tabs can be formed electrically coupling the electrically-conductive features of each package substrate 22 to the larger ESD protection grid 94 in embodiments with nominal additional cost and minimal changes to the substrate routing layout, providing that the layout or routing scheme of a given package substrate 22 can accommodate multiple instances of extension tab 70 without violating design rules. Further, the integration of multiple extension tabs 70 at different locations within a given substrate 22 may enhance ESD protection of packaged die by ensuring that a low impedance path to ground is provided for dissipating or damping the ESD energy regardless of the particular location or "strike point" at which an ESD event may occur. This may be particularly beneficial in the case of substrates utilized in fabricating larger SiPs, such as substrates 22 shown in FIG. 5, having a relatively large area over which such ESD events may occur.

Peripheral machine ground contacts 92 are beneficially located adjacent one or more outer peripheral edges of substrate strip 82 to facilitate contact with an electrically-grounded feature of one or more pieces of equipment utilized to process substrate strip 82 (and, thus, assemble the microelectronic packages) during array-level processing, as performed during process stage 78 of package fabrication method 74 (FIG. 4). In the example of FIG. 4, substrate strip 82 may be subjected to at least the following process steps or stages during array-level processing: die attach 106 performed utilizing a die attach machine 108, wire bonding 110 conducted utilizing a wire bonding machine 112, and overmolding 114 performed utilizing a suitable molding (e.g., injection or transfer molding) apparatus (not shown) to yield one or more overmolded, interconnected package arrays 116. Following array-level processing, the interconnected package arrays 116 are singulated during process stage 80, and any additional process steps may be conducted to yield a plurality of singulated packages 20 completing package fabrication method 74. These processing steps are provided by way of example only, noting that other process steps may be carried-out during array-level processing of an interconnected substrate array in alternative embodiments. For example, a different interconnection technique other than wire bonding may be utilized to electrically interconnect the microelectronic device(s) with the package terminal connections in embodiments, such as a three dimensional printing process utilizing an electrically-conductive material (e.g., an ink containing metal particles) to form the requisite interconnect lines. Similarly, in other embodiments, overmolding may not be performed; and, perhaps, a different type of package enclosure may be bonded to each package substrate 22 to enclose the microelectronic component(s) contained therein. Finally, while process stage 106 is referred to herein as a "die attach" process stage, it will be appreciated than any number and type of microelectronic components (including discrete passive SMD components) may also be bonded to each package substrate 22 during stage 106 in addition to one or more dies.

As previously indicated, peripheral machine ground contacts 92 are advantageously formed to extend alongside an outer edge region of substrate strip 82 to facilitate contact with grounded features of one or more pieces of processing equipment utilized during array-level processing of strip 82. An example of such a grounded machine feature 118 is shown in FIG. 5 for a generalized piece of processing equipment or machine 120 having an upper support surface 122, such as the upper surface of a metal chuck, which supports substrate strip 82 (and other such substrate strips) during the array-level processing step or steps conducted utilizing machine 120. Grounded machine feature 118 assumes the form of a gripper mechanism in embodiments; the term "gripper mechanism" broadly defined herein to refer to any mechanical feature of an array-level manufacturing machine, such as a die bond machine or a wire bond machine, which engages workpieces (here, interconnected substrate arrays) to clamp or hold the workpiece against a support surface (e.g., support surface 122) during processing. The term "indexer" is also utilized herein to refer to a gripper mechanism that further functions to selectively advance or move a workpiece (interconnected substrate array) relative to the machine support surface in a controller manner. As indicated in FIG. 5 by symbol 124, such a gripper mechanism 118 may be at least partially composed of an electrically-conductive material (e.g., a metal or alloy), which is electrically grounded and brought into contact with a given peripheral machine ground contact 92 to secure substrate strip 82 prior to processing (e.g., die attach or wire bonding). Specifically, gripper mechanism 188 may be electrically coupled to the chassis ground of processing equipment 120, which is, in turn, electrically coupled to Earth ground to provide a return path for dissipating excess current from ESD events.

In embodiments, support surface 122 may also be electrically grounded, as further indicated by symbol 126 in FIG. 5. Accordingly, in other embodiments, peripheral machine ground contacts 92 may further be exposed along the backside (non-illustrated principal surface) of substrate strip 82 for grounding with support surface 122. Notably, such a backside grounding may not be reliably provided by conductive features located on the backside of the interconnected package substrates 22 due to intermittent contact between the backside of the package substrates 22, noting that the entirety of substrate strip 82 may not be held flat or flush against support surface 122 in embodiments due to, for example, the manner in which strip 82 is advanced through a particular piece of processing equipment Additionally or alternatively, dielectric solder mask features may be present on the backside of substrate strip 82, thereby preventing physical contact between any such electrically-conductive backside features and support surface 122. Comparatively, the provision of peripheral machine ground contacts 92, as exposed along the upper surface or frontside of substrate strip 82, provides a reliable interface for contacting a grounded feature of processing equipment 120 via contact with gripper mechanism 118 or another grounded structural feature of equipment 120 (e.g., a spring-loaded pin or plunger), which descends into contact with (or is otherwise brought into contact with) peripheral machine ground contacts 92 when appropriate. Again, however, it is possible to provide peripheral machine ground contacts along the backside of substrate strip 82 (particularly, if such contact features are raised) for contacting grounded support surface 122 for enhanced ESD dissipation in addition to or in lieu fo contact between peripheral machine ground contacts 92 exposed along the frontside or upper surface of strip 82, as shown in FIG. 5 and described further below.

Turning next to FIGS. 6-10, several manufacturing steps suitably carried-out to fabricate a plurality of microelectronic packages, while reducing the likelihood of array-level fabrication ESD damage, are illustrated in accordance with an example implementation of example package fabrication method 74 (FIG. 4). Referring initially to FIG. 4, a limited region of substrate strip 82 is shown including a fully-depcited package substrate 22' border by two partially-depicted package substrates 22'; the prime symbol denoting that the illustrated package substrates 22' are shown in their pre-singulated form. With respect to the centrally-depicted package substrate 22', the cross-sections shown in FIGS. 6-10 generally correspond with the cross-section of LGA package 20 shown in FIG. 2, with like reference numerals carried forward to designate those structural features previously discussed above. Package substrates 22' remain interconnected as substrate strip 82 at the present juncture of manufacture and are connected by (and, therefore, interspersed with) singulation streets 128; that is, regions of substrate strip 82 removed during subsequent singulation of strip 82, as described below in connection with FIG. 10. Consequently, at this stage of manufacture, ESD grid lines 96 remain intact and are located within singulation streets 128, as shown. It can further be seen that extension tabs 70 reside extend to singulation streets 128 to connect to ESD grid lines 96 and, therefore, the larger ESD protection grid 94 (FIG. 5). ESD grid lines 70, 96, 98 may be formed in conjunction with the other electrically-conductive features of package substrates 22' during substrate fabrication (e.g., utilizing well-known metal plating and patterning processes) and, specifically, may be formed as part of an upper patterned metal layer formed across the substrate panel from which substrate strip 82 is cleaved. The particular manner in which ESD grid lines 70, 96, 98 are formed will vary among embodiments, however, depending upon ESD protection grid design and substrate type (again noting that various types of substrates can be utilized in connection with embodiments of the present disclosure).

Referring to FIG. 7, die attach is next performed to bond one or more dies 30 to their corresponding die attach regions 31 via electrically-conductive bond layers 32 and, perhaps, to attach other microelectronic components to other non-illustrated regions of each package substrate 22. As previously emphasized, ESD events can occur during the die attach process, as indicated in FIG. 7 by symbol 130. In the absence of ESD protection grid 94, including the illustrated extension tabs 70 and ESD grid lines 98, a low resistance electrical path is ground is not provided when (as frequently occurs in conventional array-level processing) the electrically-conductive features of substrate strip 82 do not contact a grounded region of the processing equipment (here, the die bond equipment utilized to attach IC dies 30) and are left electrically floating. In this case, significant static e-fields can accumulate along the respective frontsides 34 of IC dies 30; and, when a sufficient differential develops, discharge through IC dies 30 resulting in potential ESD damage to sensitive regions of dies 30 (e.g., transistor gate dielectrics) and/or other potentially damaging other ESD-sensitive components mounted to package substrates 22. In the case of transistor damage, such ESD damage may exacerbate gate-source leakage (IGSS) levels, threshold voltage mismatch (ΔVth), and other critical parameters, degrading die performance. Comparatively, in the illustrated example, ESD protection grid 94 completes a low resistance electrical path to ground, as represented by dashed line 132 in FIG. 7. This path 132 extends from die attach regions 31, through electrically-conductive features of interconnected package substrates 22' (including ground planes 48), through extension tabs 70 and ESD protection grid 94 generally, through peripheral machine ground contacts 92 (FIGS. 4 and 5), and ultimately to the electrical ground system through the grounded feature(s) of the processing equipment (here, die attach machine 108 (FIG. 4)) contacting peripheral machine ground contacts 92 of substrate strip 82. By conduction along this path, static charge can readily dissipate to reduce charge build-up along the respective frontsides 34 of IC dies 30; and, therefore, preclude the occurrence of ESD events during die attach or reduce the severity of such ESD events should they occur.

Figure 8:
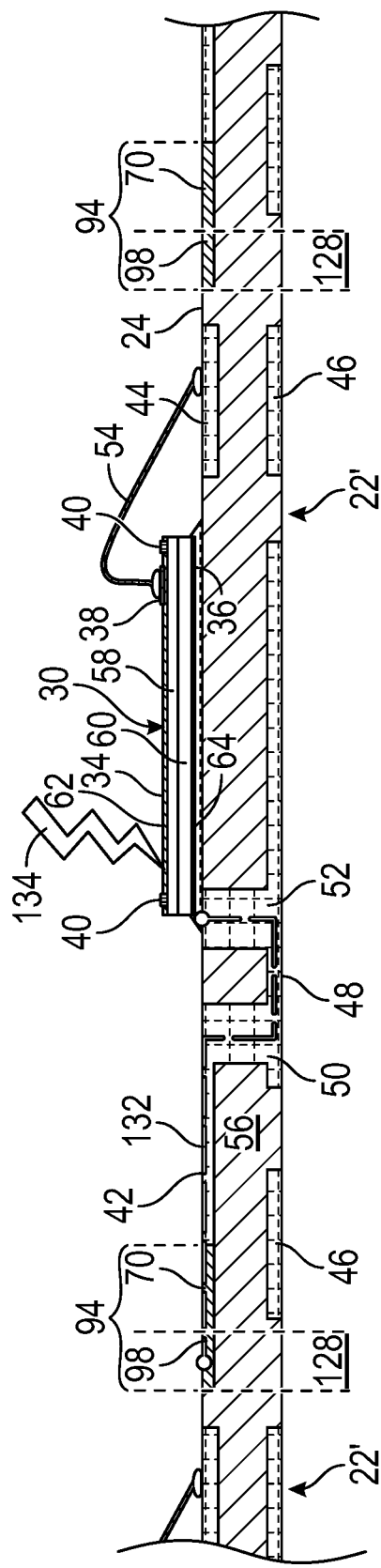

Progressing to FIG. 8, wire bonding is performed following die attach to form wire bonds 54 electrically interconnecting the newly-attached dies 30 to the terminal connections of package substrates 22' and further form interconnections with the various other microelectronic components bonded to substrates 22', if present Again, as indicated by symbol 134, severe ESD events can occur during wire bonding absent the provision of ESD protection grid 94 potentially damaging dies 30 and other sensitive components bonded to package substrates 22'. However, due to the integration of ESD protection grid 94 in the present example, the above-described low resistance electrical path 132 is formed extending from die attach regions 31, through ground planes 48, through extension tabs 70 and remainder of ESD protection grid 94, and ultimately to one or more peripheral machine ground contacts 92 placed in contact with a grounded feature of the processing equipment; e.g., in the case of manufacturing stage shown in FIG. 8, a grounded feature of wire bonding machine 112 shown in FIG. 4. In essence, then, ESD protection grid 94 provides a passive shield against ESD damage to sensitive package components that may otherwise occur during array-level processing steps including, but not limited to, die attach (FIG. 7) and/or wire bonding (FIG. 8). Further, when provided, frontside ESD grounding structure 40 may further extend such a low resistance grounding path to the respective frontsides 34 of dies 30 for additional enhancements in ESD protection, which may be beneficial in certain implementations. In other embodiments, dies 30 may lack such ESD grounding structures 40 (e.g., such structures 40 may be less beneficial in instances in which the respective backsides 36 of IC dies 30 already serve as ground terminals as in the case of, for example, RF power dies containing FETs serving as power amplifiers and having grounded source terminals) and enhanced ESD protection may be provided solely through the integration of one or more ESD protection grids 94 into substrate strip 82.

Figure 9:
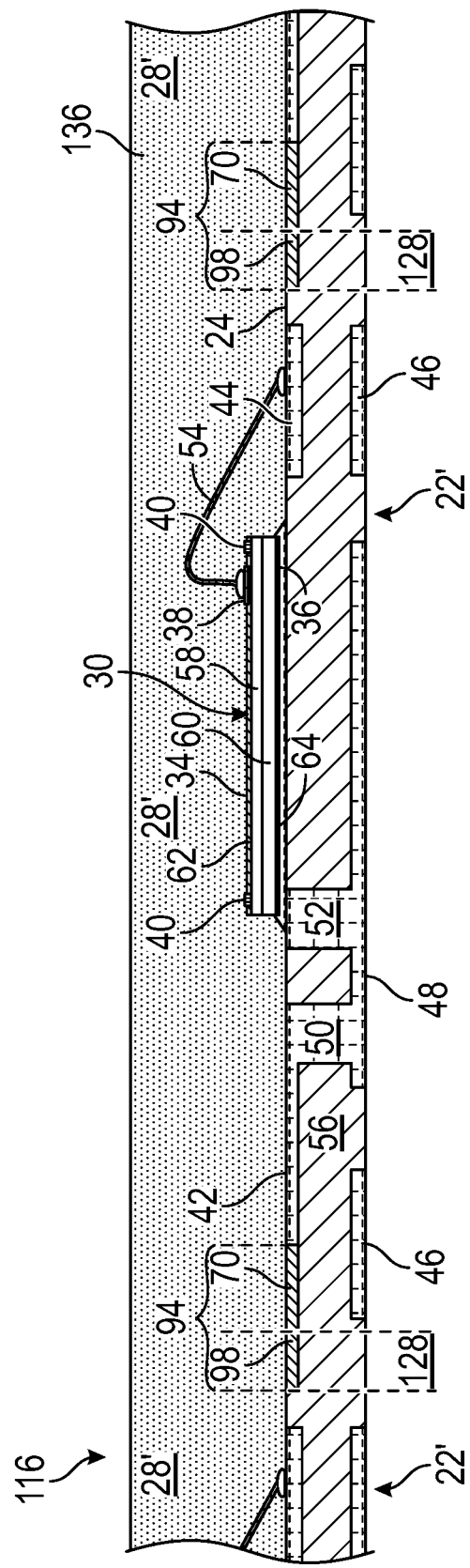
Figure 10:
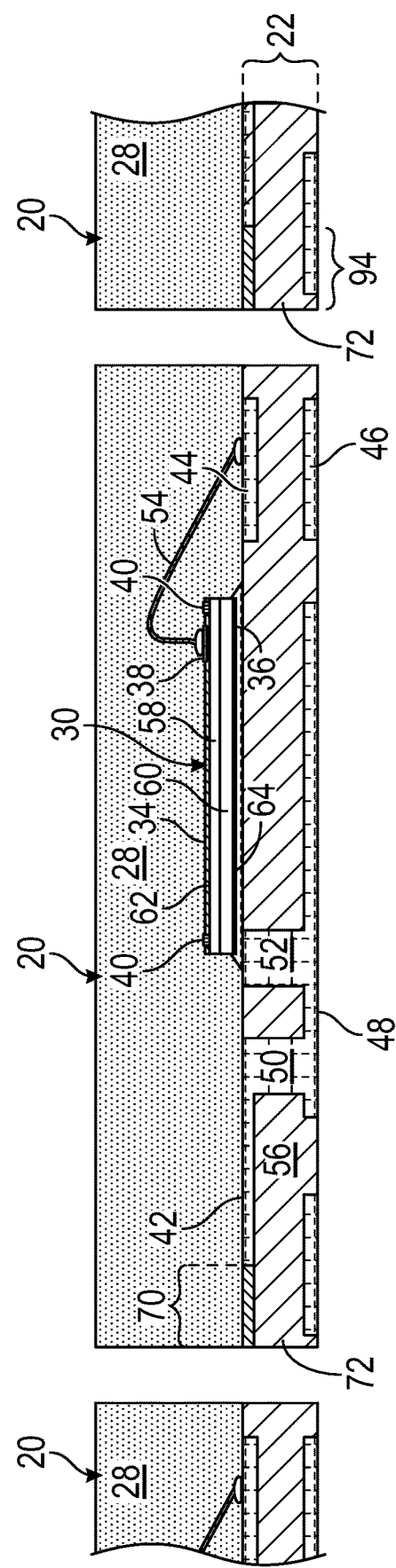

Following wire bonding, the substrate strip may be encapsulated or overmolded to yield an overmolded interconnected package array 116, as previously described in connection with STEP 114 of example package fabrication method 74. The resulting structure is shown in FIG. 9 wherein reference numeral 28' identified the molded package bodies, which remain interconnected as a larger molded mass 134 at this process stage. Singulation is then performed to separate interconnected package array 116 into discrete units or LGA packages 20, as shown in FIG. 10. Any suitable singulation process may be utilized for this purpose, including sawing or punching. Singulation removes the structure previously present within singulation streets 128 destroying a majority, if not a substantial entirety of ESD protection grids 94, by volume. However, as previously discussed and as illustrated in FIG. 10, extension tabs 70 remain as artifacts or remnants within the newly-singulated LGA packages 20, with each tab 70 extending to a singulated sidewall of a package substrate 22 or, more generally, a singulated sidewall of an LGA package 20; the term "singulated sidewall" referring to a sidewall defined by singulation. As a result, any given LGA package 20 contains at least one extension tab 70 electrically coupled to a die attach region 31, either directly or indirectly. Further extension tab 70 extends to a singulated package sidewall and breaches the sidewall (particularly the portion of the sidewall defined by an edge of the package substrate). As a result, the outer terminal end of extension tab 70 may be visible from the package exterior if additional steps are not taken to cover the exposed end of tab 70 in some manner following singulation of the interconnected package array.

CONCLUSION

There has thus been provided interconnected substrate arrays containing integrated ESD protection grids, as well methods for fabricating microelectronic packages utilizing such interconnected substrate arrays and microelectronic packages produced pursuant to such methods. Through the integration of the ESD protection grids into various interconnected substrate arrays, the likelihood and severity of array-level fabrication ESD events can be favorably minimized to improve uniformity in package performance, reduce yield loss, and lower per-package manufacturing costs as a result. Overall package reliability may also be improved by reducing array-level fabrication ESD events, which may otherwise potentially create low level, latent defects that are difficult to detect, if not non-detectable during final stage testing. Notably, embodiments of the ESD protection grids described herein can be integrated in a wide range of interconnected substrate types and designs, with minor layout changes and nominal cost; e.g., embodiments of the above-described package fabrication processes may be beneficially utilized in conjunction with any substrate array or "carrier" that is continually or intermittently left electrically floating during array-level processing, absent the provision of the ESD protection grids described herein. Further, the ESD protection grids are compatible with various different pieces of processing equipment presently in existence. Finally, in at least some instances, embodiments of the above-described fabrication method may provide additional enhancements in ESD protection through the integration of a frontside ESD grounding structure, which may be formed on the frontside of a semiconductor die contained within a given microelectronic package. When present, such a frontside ESD grounding structure may further help provide a low resistance electrical path from the frontside of a given die, to the backside of the die, ultimately through the ESD protection grid, and to an electrical ground contact provided by the machinery or equipment utilized to processing the microelectronic package along with other packages during array-level processing.

In embodiments, a method for fabricating microelectronic packages includes independently fabricating, purchasing, or otherwise obtaining an interconnected substrate array. The interconnected substrate array includes package substrates having die attachment regions, singulation streets interspersed with the package substrates, a peripheral machine ground contact adjacent an edge region of the interconnected substrate array, and an ESD protection grid including ESD grid lines electrically coupling the die attachment regions to the peripheral machine ground contact. The ESD grid lines are at least partially formed in the singulation streets of the interconnected substrate array. The method further includes the step or process of performing array-level fabrication steps to produce an interconnected package array utilizing the interconnected substrate array, while electrically coupling the die attachment regions to electrical ground through the ESD protection grid during at least one of the array-level fabrication steps. After performing the array-level fabrication steps, the interconnected package array is singulated to yield a plurality of singulated microelectronic packages. Further, in at least some implementations, performing the array-level fabrication steps may include attaching IC dies to the die attachment regions utilizing a die bond machine, while maintaining contact between the peripheral machine ground contact and a grounded feature of the die bond machine; e.g., the IC dies may be bonded to the die attachment regions utilizing an electrically-conductive bond material. Additionally or alternatively, in an absence of the ESD protection grid, the die attachment regions would be electrically floating when attaching the IC dies to the die attachment regions utilizing the die bond machine. Stated differently, but for the provision of the ESD protection, the die attachment regions would be electrically floating when attaching the IC dies to the die attachment regions utilizing the die bond machine.

Interconnected substrate arrays, such as substrate strips, having integrated ESD protection grids have also been provided. In embodiments, the interconnected substrate array includes package substrates including die attachment regions, singulation streets interspersed with the package substrates, at least one peripheral machine ground contact adjacent an edge region of the interconnected substrate array, a dielectric substrate array body, and an ESD protection grid formed in the dielectric substrate array body. The ESD protection grid includes ESD grid lines electrically coupling the die attachment regions to the peripheral machine ground contact. The ESD grid lines are at least partially formed in the singulation streets of the interconnected substrate array. Additionally, in at least some instances, the interconnected substrate array assumes the form of a substrate strip having a substantially rectangular planform shape, the package substrates are arranged in at least a first grid layout, and the peripheral machine ground contact is formed as an elongated metal contact located adjacent and extending substantially parallel to an elongated side edge of the substrate strip. In other instances, the ESD protection grid is predominately located in the singulation streets by volume, and the ESD grid lines each have a thickness that less than half a thickness of the package substrates. Additionally or alternatively, the package substrates comprise ground planes through which the die attachment regions are electrically coupled to the ESD protection grid.

The foregoing has also disclosed microelectronic packages of the type fabricated utilizing interconnected substrate arrays having integrated ESD protection grids. In embodiments, the microelectronic package includes a package substrate having a die attachment region and having singulated sidewalls, an IC die having a die backside facing the die attachment region and having a die frontside opposite the die backside, and an electrically-conductive bond layer bonding the IC die to the die attachment region. A severed ESD protection grid line (e.g., the above-described extension tab 70) is electrically coupled to the die attachment region. Further, the severed ESD protection grid line extends to and breaches or penetrates one of the singulated sidewalls of the package substrate. In at least some implementations, the microelectronic package further includes an ESD grounding structure formed on the die frontside, having ring-shaped geometry, and extending around an outer peripheral portion of the die frontside. When provided, the ESD grounding structure is electrically coupled to the die attachment region through the die backside and through the electrically-conductive bond layer.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like may have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. An interconnected substrate array, comprising:
    package substrates including die attachment regions;
    singulation streets interspersed with and interconnecting the package substrates;
    a peripheral machine ground contact adjacent an edge region of the interconnected substrate array;
    a dielectric substrate array body; and
    an electrostatic discharge (ESD) protection grid formed in the dielectric substrate array body and including ESD grid lines electrically coupling the die attachment regions to the peripheral machine ground contact, the ESD grid lines at least partially formed in the singulation streets of the interconnected substrate array.

2. The interconnected substrate array of claim 1, wherein the interconnected substrate array comprises a substrate strip having a substantially rectangular planform shape;
    wherein the package substrates are arranged in at least a first grid layout; and
    wherein the peripheral machine ground contact is formed as an elongated metal contact located adjacent and extending substantially parallel to a side edge of the substrate strip.

3. The interconnected substrate array of claim 1, wherein the ESD protection grid is predominately located in the singulation streets by volume;
    wherein the package substrates have an average thickness; and
    wherein the ESD grid lines each have a thickness that is less than half the average thickness of the package substrates.

4. The interconnected substrate array of claim 1, wherein the package substrates comprise ground planes through which the die attachment regions are electrically coupled to the ESD protection grid.

5. The interconnected substrate array of claim 1, wherein a volumetric majority of the ESD protection grid is located within the singulation streets of the interconnected substrate array.

6. The interconnected substrate array of claim 1, wherein the peripheral machine ground contact is formed in a frontside of the interconnected substrate array and positioned to contact a grounded feature of equipment utilized to process the interconnected substrate array.

7. The interconnected substrate array of claim 1, wherein the ESD protection grid comprises:
   longitudinal ESD grid lines;
   lateral ESD grid lines intersecting with the longitudinal ESD grid lines to form a lattice; and
   extension tabs electrically coupled between the lattice and the die attachment regions of the package substrates.

8. The interconnected substrate array of claim 7, wherein the longitudinal ESD grid lines and the lateral ESD grid lines are located within the singulation streets of the interconnected substrate array; and
   wherein the extension tabs extend into the singulation streets of the interconnected substrate array.

9. The interconnected substrate array of claim 7, wherein the extension tabs directly connect to the die attachment regions of the package substrates.

10. The interconnected substrate array of claim 1, further comprising an electrical grounding path extending from the die attach regions, through electrically-conductive features of the package substrates, through the ESD protection grid, and to the peripheral machine ground contact.

11. A microelectronic package, comprising:
   a package substrate having a die attachment region and having singulated sidewalls;
   an integrated circuit (IC) die having a die backside facing the die attachment region and having a die frontside opposite the die backside;
   an electrically-conductive bond layer bonding the IC die to the die attachment region;
   a severed electrostatic discharge (ESD) protection grid line and electrically coupled to the die attachment region, the severed ESD protection grid line extending to and breaching one of the singulated sidewalls of the package substrate; and
   an ESD grounding structure formed on the die frontside, having a ring-shaped geometry, and extending around an outer peripheral portion of the die frontside, the ESD grounding structure electrically coupled to the die attachment region through the die backside and through the electrically-conductive bond layer.

12. The microelectronic package of claim 11, wherein the microelectronic package and the IC die comprise a power amplifier package and a radio frequency power die, respectively.

13. The microelectronic package of claim 11, wherein ESD grounding structure is electrically coupled to the severed ESD protection grid line.

* * * * *